United States Patent [19]

Powell

[11] 3,947,863

[45] Mar. 30, 1976

[54] CHARGE COUPLED DEVICE WITH ELECTRICALLY SETTABLE SHIFT DIRECTION

[75] Inventor: Michael W. Powell, Mesa, Ariz.

[73] Assignee: Motorola Inc., Chicago, Ill.

[22] Filed: June 18, 1975

[21] Appl. No.: 587,929

Related U.S. Application Data

[63] Continuation of Ser. No. 375,254, June 29, 1973, abandoned.

[52] U.S. Cl. .................................. 357/24; 357/23
[51] Int. Cl.² ........................................ H01L 29/78
[58] Field of Search .............................. 357/23, 24

[56] References Cited
UNITED STATES PATENTS

| | | | |
|---|---|---|---|
| 3,719,866 | 3/1973 | Naber et al. | 357/24 |
| 3,767,983 | 10/1973 | Berglund | 357/24 |

Primary Examiner—Martin H. Edlow
Assistant Examiner—E. Wojciechowicz
Attorney, Agent, or Firm—Henry T. Olsen; Harry M. Weiss

[57] ABSTRACT

A monolithic two-phase charge coupled MNOS device having on a substrate an oxide layer having alternate relatively thin and thick regions thereof and a nitride layer thereon. Alternate electrodes for distributing, respectively, first and second phase clock signals are provided on the nitride layer. Each electrode overlays both a thin region and an adjacent thick region in the oxide layer. The MNOS devices formed by an electrode, the nitride layer, a thin oxide region in the oxide layer, and the substrate have electrically alterable threshold voltages, which permits electrical alteration of the surface potential pattern, so that the direction of transfer of a charge packet during the shifting operation may be electrically predetermined.

7 Claims, 3 Drawing Figures

CHARGE COUPLED DEVICE WITH ELECTRICALLY SETTABLE SHIFT DIRECTION

This is a continuation, of application Ser. No. 375,254, filed June 29, 1973, now abandoned.

BACKGROUND OF THE INVENTION

The invention relates to charge coupled memory devices, and more particularly to two-phase charge coupled devices wherein the direction for shifting a charge packet is electrically alterable.

DESCRIPTION OF THE PRIOR ART

Charge coupled devices operate by transferring charge, which represents information, between potential wells created at the surface of the semiconductor under the oxide. This operation is based on storing and transferrring minority carriers between closely spaced MOS capacitors which are pulsed into a deep depletion mode by a multi-phase clock voltage. Basically, charge coupled devices (CCDs) are dynamic shift register devices, and can be used wherever a serially accessed memory is required. CCDs can also be utilized to sense images. Whether the devices are used as memory or as image sensors, information in the form of minority carrier charge concentrations may be stored in a potential well created in the semiconductor at the interface between the dielectric and the semiconductor. This charge is then transferred along the semiconductor surface in shift register fashion by manipulation of the voltages on the MOS capacitor gate electrodes.

Several versions of charge coupled devices have been described in the literature, including four-phase, three-phase and two-phase devices. A brief descriiption of prior art charge coupled devices is found in *Electronics*, June 21, 1971, pp. 50–59. The prior art devices have a number of disadvantages, including the large number of clock voltages required for the three-phase and four-phase devices. The prior art two-phase charge coupled devices require a relatively complex overlapping gate electrode structure to provide asymmetrical potential wells which determine the direction of shift. The direction of shifting of the minority carrier charge packet is controlled by the connections between the clock lines and the gate electrodes and by the relative magnitudes of the clock voltages. However, none of the prior art devices provide electrically alterable direction of shift of the minority carrier charge packet.

The present invention solves problems of the prior art charge coupled devices by providing a simple, non-overlapping gate electrode structure and by providing a dielectric structure which permits electrically altering the direction of shift of the charge packet.

SUMMARY OF THE INVENTION

It is an object of this invention to provide an improved charge coupled device.

It is another object of this invention to provide a charge coupled device having a first dielectric layer of varying thickness on a body of semiconductor and a second dielectric layer thereon for providing an electrically alterable direction of charge transfer.

It is another object of this invention to provide a two-phase charge coupled device utilizing non-overlapping gate electrodes.

Briefly described, the invention is a monolithic charge coupled device having on a semiconductor body a first dielectric layer having first and second regions therein of different thickness and a second dielectric layer on the first dielectric layer. A plurality of spaced conductive gate electrodes each overlays a first region and an adjacent second region of the first dielectric layer. Each MOS capacitor which is formed by a conductive electrode, the second dielectric layer, and a thin region of the first dielectric layer, has an electrically alterable threshold voltage, which may be preset to determine the direction of the transfer of surface charge of the charge coupled device. The first dielectric layer may be silicon dioxide and the second dielectric layer may be silicon nitride.

DESCRIPTION OF THE INVENTION

Figure 1:
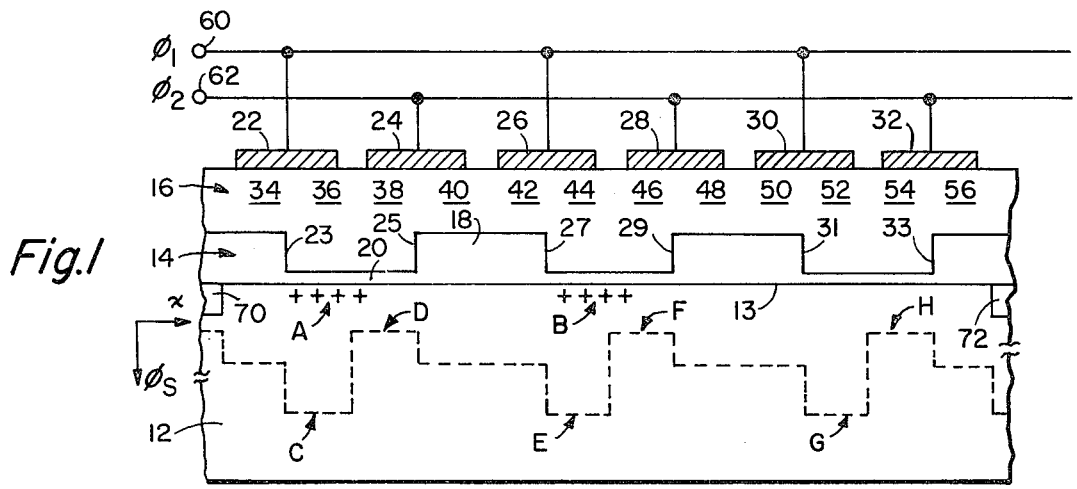
FIG. 1 is a cross-sectional diagram of an embodiment of the invention including thereon a graphical representation of the surface potential distribution at the semiconductor surface for a particular combination of electrode voltages.

Referring to FIG. 1, which is a cross-sectional diagram of a preferred embodiment of the invention, monolithic charge coupled device 10 includes semiconductive body 12 having a major surface 13 thereof. Semiconductive body 12 may, for example, be N type silicon having a resistivity typically in the range from 3 to 10 ohm-centimeters. A first dielectric layer 14, which advantageously is silicon dioxide, is provided on surface 13. Dielectric layer 14 has a plurality of adjacent, alternating relatively thick regions 18 and relatively thin regions 20, the thickness of regions 20 being substantially less than that of regions 18. Second dielectric layer 16 is formed on the upper surface of dielectric layer 14. The thicknesses of regions 20 may be in the range from 15 – 200 angstrom units, while the thicknesses of regions 18 may be typically greater than 200 angstrom units. Dielectric layer 16 may be silicon nitride, and may be in the range of 200 – 1000 angstrom units in thickness. It should be recognized that the drawings are not drawn to scale, and that the relative thickness of regions 18 and 20 are exaggerated in FIGS. 1 – 3, and that the thickness of layer 16 is essentially constant. A plurality of conductive electrodes 22, 24, 26, 28, 30, and 32 is provided on the upper surface of dielectric layer 16. Conductive electrodes 22, 26, and 30 are connnected to terminal 60, which has clock voltage $\phi_1$ applied thereto, while the alternate electrodes 24, 28, and 32, are connected to conductor 62, which has clock voltage $\phi_2$ applied thereto.

Still referring to FIG. 1, the plurality of alternating first and second regions 18 and 20 are depicted as having boundaries 23, 25, 27, 29, 31, and 33 therebetween. Conductive electrodes 22, 24, 26, 28, 30, and 32 are, respectively, substantially symmetrically positioned in FIG. 1 over boundaries 23, 25, 27, 29, 31, and 33. The structure may be considered to form a plurality of MNOS capacitors, some of which have fixed threshold voltages and others of which have alterable threshold voltages. The threshold voltage characteristics of MOS (or MNOS) capacitors are widely described in the literature, and will be only briefly described hereinafter to facilitate description of the operation of preferred embodiments of the invention.

From FIG. 1 it can be seen that a plurality of MNOS capacitors are formed by the above-described structure, namely, MNOS capacitors 34, 36, 38, 40, 42, 44, 46, 48, 50, 52, 54, and 56. Each of the MNOS capacitors formed by a portion of one of the conductive electrodes, a portion of dielectric layer 16, and a portion of one of the regions 18 of dielectric layer 14 and the semiconductive body 12 is a fixed threshold MNOS capacitor, since the thickness of region 18 is sufficiently great to prevent substantial movement of charge therein. However, the remaining MNOS capacitors, which include a portion of one of the thin regions 20 of dielectric layer 14, have a threshold voltage which is electrically alterable. Thus, it is seen that MNOS capacitors 34, 40, 42, 48, 50, and 56 are fixed threshold devices, while MNOS capacitors 36, 38, 44, 46, 52, and 54 are alterable threshold devices.

A packet of positive charge, designated by the letter A, may be introduced into a charge storage site in the semiconductive body at surface 13 by forward biasing input device 70, which is a P type region formed in semiconductor body 12 at surface 13. Sensing device 72, which is also a P type region formed in semiconductor body 12 at surface 13, undergoes a voltage transition when a packet of positive charges is transferred thereto. Sensing device 72 may also be part of a regeneration device, as described in the previously referenced article in *Electronics*, and in "Charge Coupled Digital Circuits", W. F. Kosonocky and J. E. Carnes, *IEEE Journal of Solid State Circuits*, Vol. SC6, No. 5, Oct., 1971, pp. 314–321. The dotted line graph superimposed in semiconductive body 12 designates the distribution of the surface potential $\phi_s$ in the X direction along surface 13 when the voltages $\phi_1$ and $\phi_2$ are both near $V_{TO}$. $V_{TO}$ is the threshold voltage of the fixed threshold devices 34, 40, 42, etc., and may, for example, be approximately −2 volts. The voltage-capacitance characteristics for a metal-insulator-semiconductor structure are well described in the literature. For Example, see "Charge Transport and Storage in Metal-Nitride-Oxide-Silicon (MNOS) Structure", *Journal of Applied Physics*, Vol. 40, No. 8, July 1969, pp. 3307–3319, and also see "Switching and Storage Characteristics of MIS Memory Transistors", *RCA Review*, Vol. 30, June 1969, pp. 335–365.

It is well known that the threshold voltage of MNOS structures can be electrically altered if the oxide in region 20, for example, is sufficiently thin and the voltage applied between the corresponding gate electrode and the semiconductor body are sufficiently large. The mechanism by which the threshold voltage may be shifted in the MNOS structure is believed to be due to either the tunneling of electrons across the oxide insulator, if it is sufficiently thin (approximately 15 – 35 angstrom units) or by drift of ions across the thin oxide for somewhat larger thicknesses, for example, 50 – 200 angstrom units.

In the diagram of FIG. 1 it may be assumed for purposes of explanation of operation that the threshold voltage of MNOS devices 36, 44, and 52 have been electrically altered to be equal to approximately +4 volts by applying a large negative voltage to terminal 60 for a sufficiently long time to cause an accumulation of negative trapped charge at the corresponding interface surface between dielectric 16 and regions 20 for the case when dielectric region 20 is 50 – 200 angstrom units thick. Similarly, by applying a sufficiently positive pulse to conductor 62, it may be assumed for purposes of illustrating operation, that the threshold voltages of MNOS devices 38, 46, and 54 have been electrically altered to be equal to approximately −8 volts, and that the threshold voltage of MNOS devices 36, 44, and 52 have been electrically altered to be equal to approximately +4 volts.

Also illustrated in FIG. 1 is a second packet of positive charge, designated by the letter B. In the present discussion, it is assumed that charge packet B has been previously shifted to the indicated charge storage site during the normal shifting operation of the device.

With $\phi_1$ and $\phi_2$ both equal to approximately −2 volts, the surface potential well pattern at surface 13 is designated by the dotted line in FIG. 1. Positive charge packet A resides at the site of a potential minimum on the dotted line, designated by the letter C, since MNOS device 34 is in the depletion region and MNOS device 36 is in the inversion region, since it is turned on by an overdrive voltage of 6 volts. (The overdrive voltage is the excess magnitude of gate to semiconductor voltage over the magnitude of the threshold voltage). MNOS device 38, having a threshold voltage of approximately −8 volts, but only having −2 volts on its gate electrode, is off and in fact is in the accumulation region. (For a thorough discussion of the depletion, accumulation and inversion regions of an MOS structure, see "Physics and Technology of Semiconductor Devices", A. S. Grove, *John Wiley and Sons*, 1967.)

Thus, charge packet A is forced to remain at the location indicated by the Letter C, since the surface potentials both to the right and the left of region C are more positive, and the positive charge packet seeks a potential minimum. The same situation holds with regard to charge packet B at the position indicated by letter E on the dotted graph representing the surface potential distribution.

Figure 2:
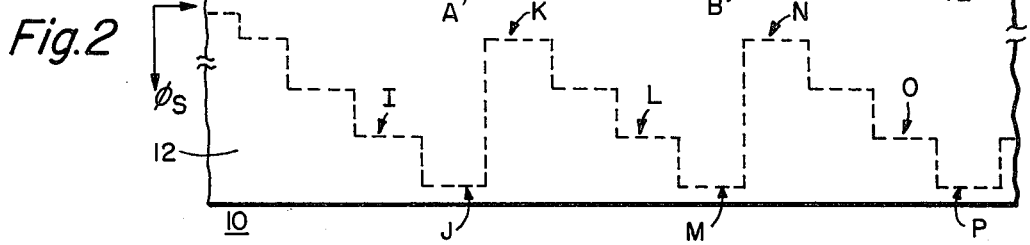
FIG. 2 is a cross-sectional diagram similar to that of FIG. 1 except that a shift of the charge packet is illustrated corresponding to a change in one of the clock voltages and in the resulting surface potential distribution.

Referring to FIG. 2, it is now assumed that the voltage $\phi_2$ on conductor 62 is changed to a sufficiently negative value to invert MNOS device 38 more strongly than MNOS device 36, thus causing a surface potential at surface 13 in device 38 to be reduced to a value lower than that indicated at point C in FIG. 1, i.e., to be reduced to the point indicated by the letter I in FIG. 2. Then, the surface potential corresponding to potential minimum J in FIG. 2 is even more negative than for the region designated by the letter I, since the threshold voltage of device 42 is only −2 volts, causing device 40 to be more strongly inverted than device 38. The positive charge packets will move to the most strongly inverted surface regions in the absence of potential barriers. An entirely analogous argument is valid for explaining the surface potential corresponding to points L and M on the surface potential distribution. Thus, it is seen that charge packets A and B shift to the right as indicated in FIG. 2 when $\phi_2$ undergoes a sufficiently large negative voltage transition.

Figure 3:
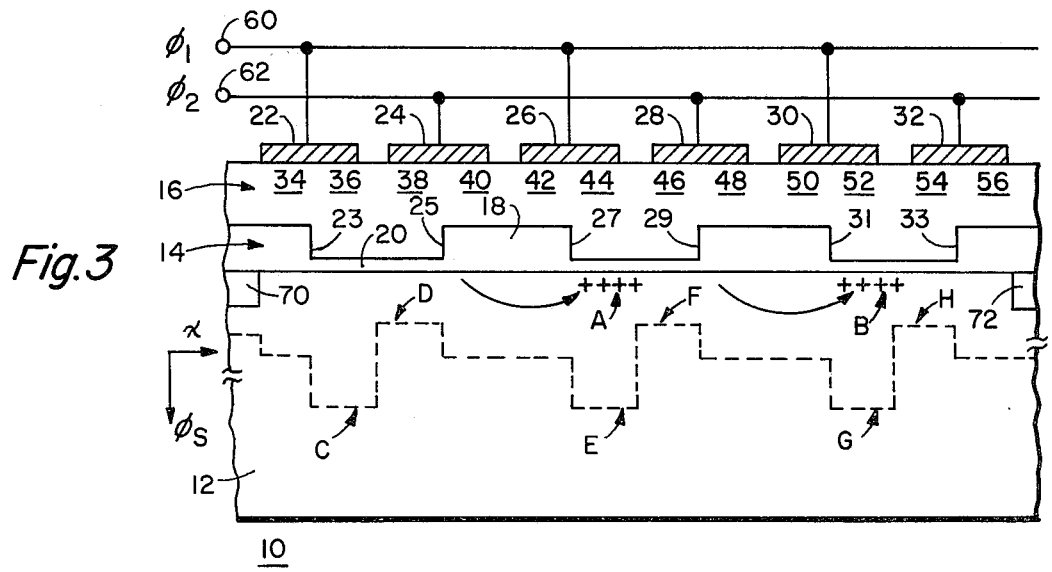
FIG. 3 is a cross-sectional diagram similar to those of FIGS. 1 and 2 and shows the shift in the charge packet as the clock voltages are returned to their original values.

Referring to FIG. 3, it is assumed that the voltage of $\phi_2$ has returned to approximately −2 volts, causing the surface potential distribution to return to the same configuration as originally shown in FIG. 1. It is seen that points E and G of the surface potential distribution graph again become potential minima, causing the charge packet A to shift further to the right to charge storage sites corresponding to points E and G on the potential distribution graph.

Thus, it is seen that shifting of information has been accomplished in a device having only two clock lines and non-overlapping gate conductors. This has not been achieved by the devices of the prior art.

After a bit of reflection, it is clear that the direction of shifting could be reversed if the voltage pattern applied to the terminals 60 and 62 is reversed and the corresponding threshold voltages written into the alterable threshold MNOS devices are reversed. However, in the two-phase charge coupled devices of the prior art, which have overlapping gate electrodes, the electrode interconnection scheme would have to be modified, and would be feasible only by fabricating new devices having different photolithographic masking patterns utilized in manufacturing of the devices; the shift direction of the prior art devices cannot be electrically altered after they are fabricated.

Thus, the present invention distinguishes over the prior art by incorporating the fixed threshold and alterable threshold MNOS capacitor structures in a single monolithic structure to produce the surface potential well pattern necessary for charge coupled device shifting operation using two-phase clock voltages and a single level of interlaced conductive electrodes.

It is seen that the monolithic charge coupled device of the invention provides a device with a low number (two) of clock voltages required and having the advantages of utilizing a lower cost, simpler technology, i.e., metal gate technology rather than the silicon gate technology (which requires both metal electrodes and doped polycrystalline silicon gate electrodes which overlap). Further, the size of each charge coupled device cell is reduced, since only half of the number of conductive electrodes are required. Further, the charge coupled device of the invention has the additional advantage that the direction of charge transfer may be altered by electrically presetting the threshold voltages of the alterable threshold MNOS devices to produce the desired potential well pattern desired during the shift operation.

While the invention has been described in relation to a preferred specific embodiment thereof, those skilled in the art will recognize that various changes in the placement of parts may be made to suit specific requirements without departing from the scope of the invention.

What is claimed is:

1. A monolithic charge coupled device for storing and sequentially transferring information in a predetermined direction comprising:

a semiconductor body having a major surface;

a first dielectric layer on said major surface, said first dielectric layer including a plurality of first regions of a first thickness and a plurality of second regions of a second thickness, said second thickness being substantially less in magnitude than said first thickness, said first and second regions being alternately positioned along said major surface;

a second dielectric layer on said first dielectric layer;

a plurality of spaced first conductive electrodes on said second dielectric layer;

a plurality of spaced second conductive electrodes on said second dielectric layer, said first and second conductive electrodes being, respectively, alternately positioned on said second dielectric layer, each of said first and second conductive electrodes disposed above a portion of one of said first regions and one of said second regions, said portion including the boundary of the regions and adjacent edges of said first and second electrodes overlying like thicknesses of said first dielectric layer;

input means on said semiconductive body for transferring information into said charge coupled device;

receiving means on said semiconductive body for receiving said transferred information;

clocking means connected to said first and second conductive electrodes for sequentially biasing said first and second conductive electrodes to produce an asymmetrical potential well configuration in said semiconductive body beneath said major surface to establish the direction of transfer of said information; and said predetermined direction being electrically alterable by electrically altering the charge at interface regions between said dielectric layer and said second region of said first dielectric layer.

2. The monolithic charge coupled device as recited in claim 1 wherein said first dielectric layer is silicon dioxide and said second dielectric layer is silicon nitride.

3. The monolithic charge coupled device as recited in claim 1 wherein first thickness is greater than 200 Angstrom units, and said second thickness is in the range from 15 to 200 Angstrom units.

4. The monolithic charge coupled device as recited in claim 1 wherein said first and second conductive electrodes are aluminum.

5. The monolithic charge coupled device as recited in claim 1 wherein the thickness of said second dielectric layer is from 200 to 1000 Angstrom units.

6. The monolithic charge coupled device as recited in claim 1 wherein said second dielectric is silicon nitride.

7. A monolithic MNOS charge coupled device for storing sequentially transferring information in an electrically predetermined direction comprising:

a semiconductive body having a major surface;

a silicon dioxide layer on said major surface, said silicon dioxide layer including a plurality of first regions of a first thickness and a plurality of second regions of a second thickness, said first region being in the range from 15 to 200 Angstrom units and said second thickness being greater than 200 Angstrom units, said first and second regions being alternately positioned along said major surface;

a silicon nitride layer on said silicon dioxide layer, said silicon nitride layer being approximately 200 to 1000 Angstrom units thick;

a plurality of spaced first metal electrodes on said silicon nitride layer;

a plurality of spaced second metal electrodes on said silicon nitride layer, said first and second metal electrodes being, respectively, alternately positioned on said silicon nitride layer, each of said first and second metal electrodes disposed above a portion of one of said first regions and one of said second regions, said portion including the boundary of the regions and adjacent edges of said first and second electrodes overlying like thicknesses of said first dielectric layer;

input means on said semiconductive body for transferring information into said charge coupled device;

receiving means on said semiconductive body for receiving said transferred information;

clocking means connected to said first and second metal electrodes for sequentially biasing said first and second conductive electrodes to produce an asymmetrical potential well configuration in said semiconductive body beneath said major surface to establish the direction of transfer of said information; and said predetermined direction being electrically alterable by electrically altering the charge at interface regions between said silicon nitride layer and said first region of said silicon dioxide layer.

* * * * *